(12) United States Patent
Tandon et al.

(10) Patent No.: US 6,876,686 B2
(45) Date of Patent: Apr. 5, 2005

(54) METHOD OF FABRICATING ACTIVE LAYERS IN A LASER UTILIZING INP-BASED ACTIVE REGIONS

(75) Inventors: Ashish Tandon, Sunnyvale, CA (US); Ying-Lan Chang, Cupertino, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 89 days.

(21) Appl. No.: 10/373,331

(22) Filed: Feb. 24, 2003

(65) Prior Publication Data

US 2004/0165631 A1 Aug. 26, 2004

(51) Int. Cl.[7] .............................. H01S 5/00; H01L 21/00
(52) U.S. Cl. .............................. 372/44; 372/43; 372/45; 372/46; 438/45; 438/46; 438/47
(58) Field of Search .......................... 372/43–44, 45–46; 438/45–47, 680–681; 117/88

(56) References Cited

U.S. PATENT DOCUMENTS

| | | | |
|---|---|---|---|
| 6,292,502 B1 | * | 9/2001 | Shimada ..................... 372/45 |
| 2002/0081764 A1 | * | 6/2002 | Springthorpe et al. ........ 438/45 |
| 2004/0065363 A1 | * | 4/2004 | Fetzer et al. ................ 136/262 |

OTHER PUBLICATIONS

G.B. Stringfellow et al. "Surfactant Effects on Ordering in GaInP Grown by OMVPE," MRS Bulletin, Fall 1999.*
Fetzer et al. "The use of a surfactant (Sb) to induce triple period in GaInP," Applied Letters, vol. 76, No. 11, Mar. 2000, pp. 1440–1442.*
Fetzer et al. "Effect of surfactant Sb on carrier lifetime in GaInP epilayers," J. of Applied Physics, vol. 91, No. 1, Jan. 2002, pp. 199–203.*

* cited by examiner

*Primary Examiner*—Minsun Oh Harvey
*Assistant Examiner*—James Menefee

(57) ABSTRACT

A laser and method for making the same are disclosed. The laser includes a p-layer, an n-layer, and an active region located between the p-layer and the n-layer. The active region includes a quantum well layer sandwiched between first and second barrier layers. The quantum well layer includes an InP-based material. The first and second barrier layers also include an InP-based material. The barrier layers are homogeneous layers of the InP-based material. The barrier layers are preferably deposited by chemical vapor deposition from precursors that include a surfactant element that inhibits the formation of P—P dimers on a surface of the barrier layer during the deposition process. In one embodiment, the surfactant element is chosen from the group consisting of Sb, Si, and Te, and the barrier material includes InGaP or AlInP.

11 Claims, 2 Drawing Sheets

METHOD OF FABRICATING ACTIVE LAYERS IN A LASER UTILIZING INP-BASED ACTIVE REGIONS

FIELD OF THE INVENTION

The present invention relates to semiconductor laser fabrication.

BACKGROUND OF THE INVENTION

Vertical cavity surface emitting lasers (VCSELs) as well as edge emitting lasers (EELs) at 1.3 μm and 1.55 μm are of great interest for fiber optic communications due to the lower signal attenuation exhibited by existing fibers at this wavelength. These lasers utilize an active region constructed from one or more quantum well layers that are separated by layers of a barrier material. One of the material systems that is being investigated to achieve emitters at this wavelength utilizes InAsP as the quantum well material and InGaP or AlInP as the barrier material in the active region. Unfortunately, lasers constructed in this material system exhibit poor high temperature performance and have a relatively broad emission spectrum.

SUMMARY OF THE INVENTION

The present invention includes a laser and method for making the same. The laser includes a top mirror, a bottom mirror and an active region located between the top and bottom mirrors. The active region includes a quantum well layer sandwiched between first and second barrier layers. The quantum well layer includes an InP-based material. The first and second barrier layers also include an InP-based material. The barrier layers are homogeneous layers of the InP-based material. The barrier layers are preferably deposited by chemical vapor deposition from precursors that include a surfactant element that inhibits the formation of P—P dimers on a surface of the barrier layer during the deposition process. In one embodiment, the surfactant element is chosen from the group consisting of Sb, Si, and Te, and the barrier material includes InGaP or AlInP.

DETAILED DESCRIPTION OF THE PREFERRED EMBODIMENTS OF THE INVENTION

Figure 1:
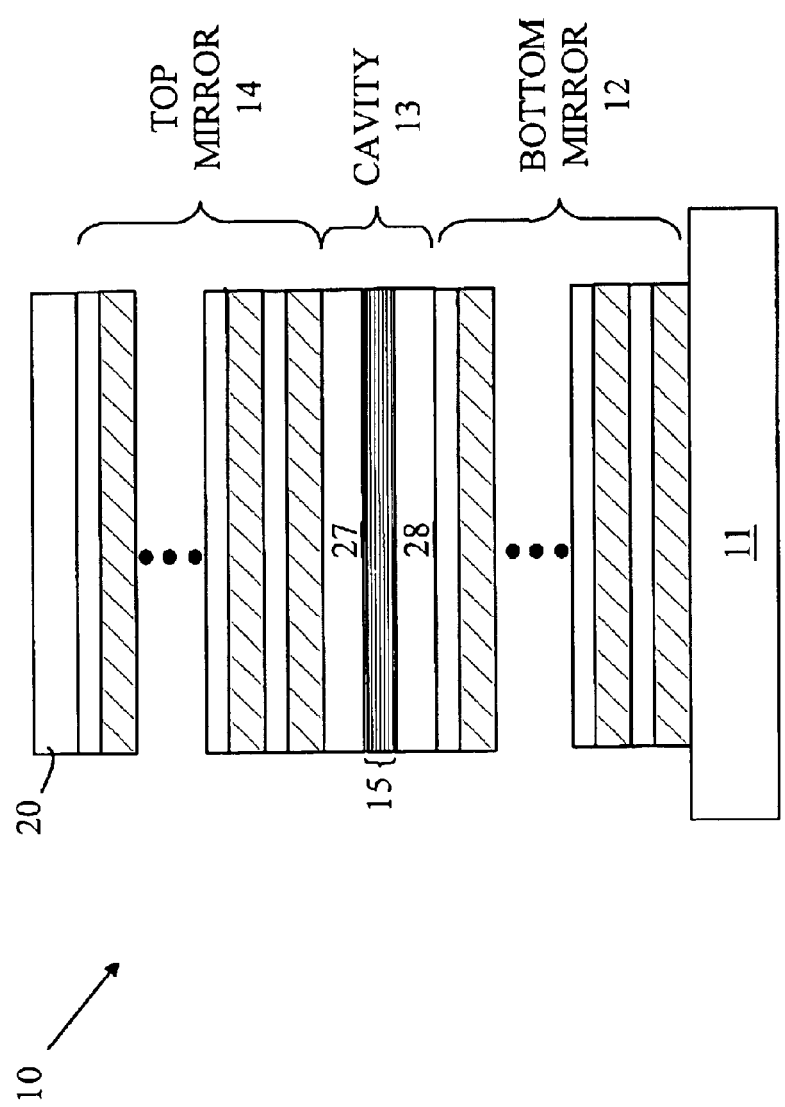
FIG. 1 is a cross-sectional view of the layers of a VCSEL 10 according to one embodiment of the present invention.

The manner in which the present invention provides its advantages can be more easily understood with reference to FIG. 1, which is a cross-sectional view of the layers of a VCSEL 10 according to one embodiment of the present invention. VCSEL 10 is constructed on a substrate 11, which, in the present embodiment includes any contact layers needed to supply power to the bottom side of the active region. VCSEL 10 includes a bottom mirror 12, an optical cavity 13, and a top mirror 14. Power is supplied via a top contact layer 20. The mirrors are conventional DBR mirrors, and hence, will not be described in detail here. For the purposes of the present discussion it is sufficient to note that the mirrors are constructed by growing alternating layers of material in which the adjacent layers have different indices of refraction. Typically, the bottom mirror is constructed from n-type materials, and the top mirror is constructed from p-type materials. However, other designs can be utilized without departing from the teachings of the present invention.

Figure 2:
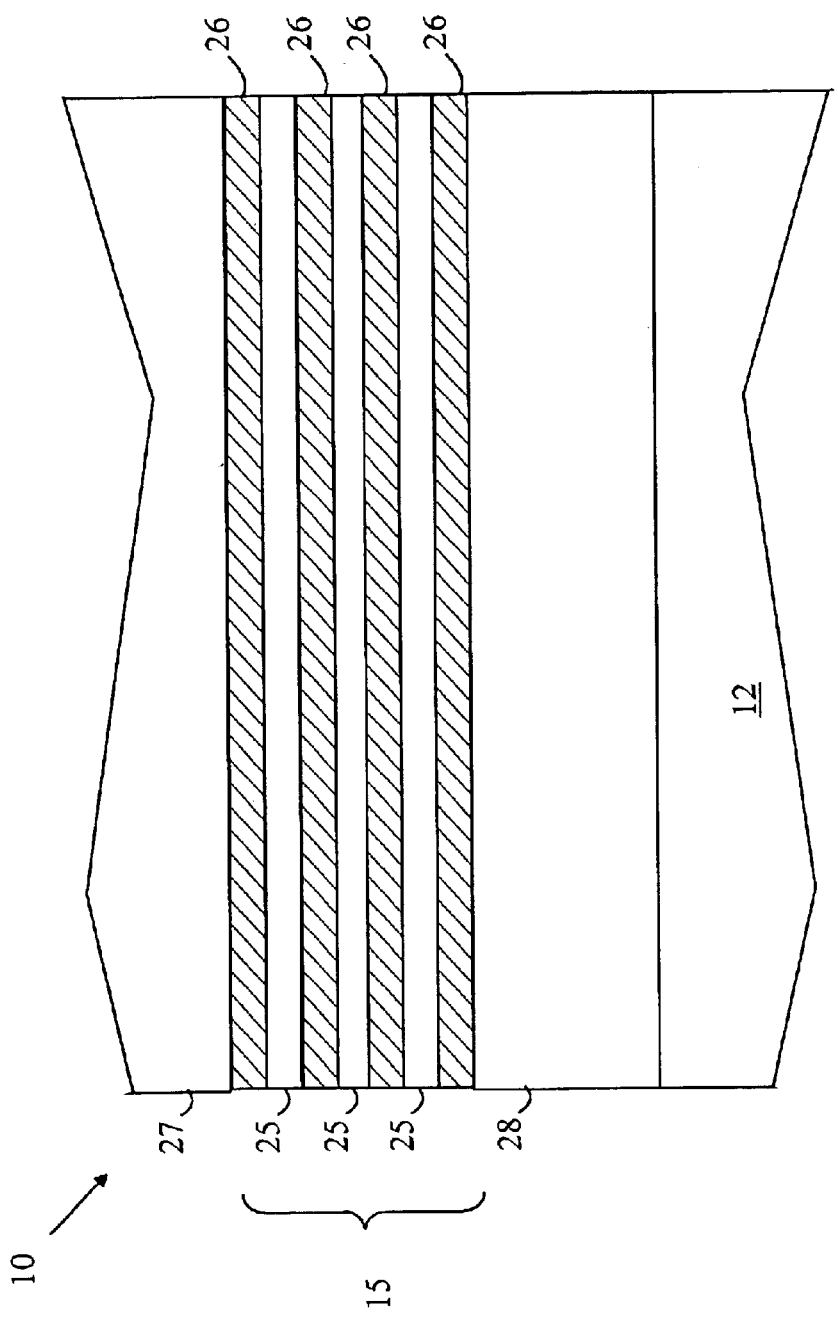
FIG. 2 is a magnified view of the active region shown in FIG. 1.

The laser cavity includes an active region 15, which is shown in greater detail in FIG. 2, which is a magnified view of the active region shown in FIG. 1. The active region is constructed from quantum well layers 25 separated by barrier layers 26. Spacer layers shown at 27 and 28 may be included to set the cavity length to the desired length for the wavelength of light being generated and to position the active region at the optimum point in the cavity formed by the top and bottom mirrors.

The various layers discussed above are preferably constructed from InP-based materials. For the purposes of this discussion, a material will be defined to be InP-based if it includes In and its lattice constant is within one percent of that of InP. Specific examples of such materials are InP, AlGaInP, InGaAsP, InAsP, and AlGaInAs. In one preferred embodiment of the invention, the quantum well layers are constructed from InAsP and the barrier layers are constructed from InGaP or AlInP.

The present invention is based on the observation that the barrier layers in prior art devices are typically grown under conditions that favor the formation of P—P dimers at the growth interface during the deposition. For example, lasers are often constructed with barrier layers that have a composition that is represented by the formula, $In_xGa_{1-x}P$, where x is approximately 0.15. In prior art devices, the layers are typically grown utilizing trimethylgallium (TMGa) or triethylgallium (TEGa), trimethylindium (TMIn) and phosphine ($PH_3$) for precursors in a MOCVD deposition system. The deposition is carried out at relatively low temperatures. Further, there is no doping of the barrier layers, and the barrier layers are grown on the (100) crystal plane of the substrate. All of these conditions favor the formation of P—P dimers on the (100) interface. Such dimers lead to alternating In-rich and Ga-rich planes. In addition, low temperature growth exacerbates the distribution differences between different atomic species. As a result, the barrier layers lack homogeneity. This lack of uniformity reduces the electron confinement in the quantum well layer and leads to the problems discussed above.

The present invention is based on the observation that the formation of P—P dimers at the growth interface during the $In_xGa_{1-x}P$ deposition can be inhibited by including an element that will inhibit the formation of such dimers without being incorporated in the barrier layer. Since this "surfactant" element is not incorporated in the barrier layer, the bandgap of the active region is not altered. Sb, Si, and Te can be utilized to inhibit the dimer formation.

In one embodiment of the present invention, (trimethylantimony) TMSb at a concentration of approximately one percent of the Group III element precursors is added to the MOCVD precursors during the barrier layer deposition. The output from the VCSELs having active regions formed in this manner exhibits narrower peaks as measured by the FWHM of the wavelength distribution of the output of the laser. Edge emitting lasers constructed in this manner exhibit substantially lower threshold voltages. From x-ray data, it was determined that the concentration of antimony incorporated into the crystal structure was less than 0.5%. This indicates that the Sb atoms are adsorbed in minute quantities to act as surfactants and the improved laser performance is not due to any alteration of the band structure via incorporation of antimony.

As noted above, the present invention can also be utilized in the fabrication of edge-emitting lasers. The edge-emitting lasers were grown using the standard MOCVD growth conditions and precursors, the only difference being the addition of this surfactant. For example, a horizontal flow MOCVD reactor can be utilized with TMGa, TMSb, TMIn, AsH$_3$ and PH$_3$ as the precursors. The QWs can be constructed from InAs$_{0.4}$P$_{0.6}$ while the barriers can be either In$_{0.85}$Ga$_{0.15}$P or In$_{0.85}$Al$_{0.15}$P. Lattice matched InGaAsP layers can be used for waveguiding and the outer cladding was InP.

The above-described embodiments utilize InGaP for the barrier layer material. However, the surfactant-based deposition system of the present invention can be advantageously employed with other barrier materials such as AlInP. It should be noted that the present invention can be applied to existing fabrication methods with a minimum of perturbation to the methodology, since the present invention requires only a minor addition to the MOCVD precursors during the growth of the quantum wells.

Various modifications to the present invention will become apparent to those skilled in the art from the foregoing description and accompanying drawings. Accordingly, the present invention is to be limited solely by the scope of the following claims.

What is claimed is:

1. A laser comprising:
   a p-layer;
   an n-layer;
   an active region located between said p-layer and said n-layer, said active region comprising a quantum well layer sandwiched between first and second barrier layers, said quantum well layer comprising an InP-based material and said first and second barrier layers comprising an InP-based material, wherein said first and second barrier layers are homogeneous layers of said InP-based material.

2. The laser of claim 1 wherein said barrier layers are deposited by chemical vapor deposition from precursors comprising a surfactant element that inhibits the formation of P—P dimers on a surface of said barrier layer during said deposition process.

3. The laser of claim 2 wherein said surfactant element is chosen from the group consisting of Sb, Si, and Te.

4. The laser of claim 2 wherein said surfactant element is present in a concentration of less than two percent in said precursors.

5. The laser of claim 1 wherein said InP-based material in said barrier layer comprises InGaP.

6. The laser of claim 1 wherein said InP-based material in said barrier layer comprises AlInP.

7. In a method for fabricating a laser having a p-layer, an n-layer, and an active region between said p-layer and said n-layer, said active region comprising a quantum well layer sandwiched between first and second barrier layers, said quantum well layer comprising an InP-base material and said first and second barrier layers comprising an InP-based material, the improvement comprises depositing said barrier layers by chemical vapor deposition from precursors comprising a surfactant element that inhibits the formation of P—P dimers on a surface of said barrier layer during said deposition process.

8. The method of claim 7 wherein said surfactant element is chosen from the group consisting of Sb, Si, and Te.

9. The method of claim 7 wherein said surfactant element is present in a concentration of less than two percent.

10. The method of claim 7 wherein said InP-based material in said barrier layer comprises InGaP.

11. The method of claim 7 wherein said InP-based material in said barrier layer comprises AlInP.

* * * * *